United States Patent
Tsai et al.

(10) Patent No.: US 9,960,639 B2
(45) Date of Patent: May 1, 2018

(54) SUPPLYING-END MODULE OF INDUCTION TYPE POWER SUPPLY SYSTEM AND VOLTAGE MEASUREMENT METHOD THEREOF

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 442 days.

(21) Appl. No.: 14/822,875

(22) Filed: Aug. 10, 2015

(65) Prior Publication Data
US 2015/0349546 A1  Dec. 3, 2015

(30) Foreign Application Priority Data
Jan. 14, 2015 (TW) .............................. 104101227 A

(51) Int. Cl.
*H02J 50/10* (2016.01)
*G01R 19/04* (2006.01)
(Continued)

(52) U.S. Cl.
CPC .............. *H02J 50/10* (2016.02); *G01R 19/04* (2013.01); *G01R 19/252* (2013.01); *H02J 5/005* (2013.01);
(Continued)

(58) Field of Classification Search
None
See application file for complete search history.

(56) References Cited

U.S. PATENT DOCUMENTS

| 4,393,516 A | 7/1983 | Itani |
| 5,270,998 A | 12/1993 | Uchiumi |

(Continued)

FOREIGN PATENT DOCUMENTS

| CN | 1142649 A | 2/1997 |
| CN | 1476535 A | 2/2004 |

(Continued)

OTHER PUBLICATIONS

Yang, "A Multi-Coil Wireless Charging System with Parasitic Mental Detection", Donghua University Master Dissertation, China Master's Theses Full-text Database, Engineering Technology II, vol. 09, May 2014.

*Primary Examiner* — Jared Fureman
*Assistant Examiner* — James Evans
(74) *Attorney, Agent, or Firm* — Winston Hsu

(57) ABSTRACT

A voltage measuring method for a supplying-end module of an induction type power supply system includes generating a coil signal on a supplying-end coil of the supplying-end module; clamping the coil signal to generate a clamp coil signal; performing signal processing on the clamp coil signal to generate a first signal and a second signal, respectively; generating a cyclic signal, a frequency of which is equal to a frequency of the coil signal; comparing the first signal and the second signal via a comparator to obtain a first time and a second time when the first signal and the second signal have an equal voltage level during a cycle of the cyclic signal; calculating a middle time of the first time and the second time; and sampling the clamp coil signal or the coil signal to obtain a peak voltage of the coil signal according to the middle time.

20 Claims, 5 Drawing Sheets

(51) Int. Cl.
*H02J 17/00* (2006.01)
*H02J 7/02* (2016.01)
*G01R 19/252* (2006.01)
*H02J 5/00* (2016.01)
*H02M 3/337* (2006.01)
*H02J 50/12* (2016.01)

(52) U.S. Cl.
CPC .............. *H02J 7/025* (2013.01); *H02J 17/00* (2013.01); *H02J 50/12* (2016.02); *H02M 3/337* (2013.01)

(56) References Cited

U.S. PATENT DOCUMENTS

| | | |
|---|---|---|
| 7,720,452 B2 | 5/2010 | Miyahara |
| 7,939,963 B2 | 5/2011 | Chang |
| 8,072,310 B1 | 12/2011 | Everhart |
| 8,217,621 B2 | 7/2012 | Tsai |
| 8,412,963 B2 | 4/2013 | Tsai |
| 8,417,359 B2 | 4/2013 | Tsai |
| 8,422,420 B1 | 4/2013 | Gulasekaran |
| 8,772,979 B2 | 7/2014 | Tsai |
| 8,810,072 B2 | 8/2014 | Tsai |
| 9,048,881 B2 | 6/2015 | Tsai |
| 9,075,587 B2 | 7/2015 | Tsai |
| 2003/0123168 A1 | 7/2003 | Yokomizo |
| 2005/0076102 A1 | 4/2005 | Chen |
| 2008/0030398 A1* | 2/2008 | Nakamura ............ G01S 7/4865 342/118 |
| 2009/0026844 A1* | 1/2009 | Iisaka .................... H02J 7/025 307/104 |
| 2009/0271048 A1 | 10/2009 | Wakamatsu |
| 2009/0284082 A1 | 11/2009 | Mohammadian |
| 2009/0302800 A1 | 12/2009 | Shiozaki |
| 2010/0237943 A1 | 9/2010 | Kim |
| 2010/0270867 A1 | 10/2010 | Abe |
| 2010/0277003 A1 | 11/2010 | Von Novak |
| 2011/0196544 A1 | 8/2011 | Baarman |
| 2012/0153739 A1 | 6/2012 | Cooper |
| 2012/0242159 A1* | 9/2012 | Lou ......................... H03H 7/40 307/104 |
| 2012/0272076 A1 | 10/2012 | Tsai |
| 2012/0293009 A1 | 11/2012 | Kim |
| 2013/0015705 A1 | 1/2013 | Abe |
| 2013/0049484 A1 | 2/2013 | Weissentern |
| 2013/0162054 A1 | 6/2013 | Komiyama |
| 2013/0162204 A1 | 6/2013 | Jung |
| 2013/0175873 A1 | 7/2013 | Kwon |
| 2013/0175937 A1 | 7/2013 | Nakajo |
| 2013/0176023 A1 | 7/2013 | Komiyama |
| 2013/0187476 A1 | 7/2013 | Tsai |
| 2013/0267213 A1 | 10/2013 | Hsu |
| 2013/0342027 A1* | 12/2013 | Tsai ..................... H04B 5/0037 307/104 |
| 2014/0024919 A1 | 1/2014 | Metzenthen |
| 2014/0077616 A1 | 3/2014 | Baarman |
| 2014/0084857 A1 | 3/2014 | Liu |
| 2014/0184152 A1 | 7/2014 | Lee |
| 2014/0355314 A1 | 12/2014 | Ryan |
| 2015/0028875 A1 | 1/2015 | Irie |
| 2015/0044966 A1 | 2/2015 | Shultz |
| 2015/0054355 A1 | 2/2015 | Ben-Shalom |
| 2015/0123602 A1 | 5/2015 | Patino |
| 2015/0162054 A1 | 6/2015 | Ishizu |
| 2015/0162785 A1 | 6/2015 | Lee |
| 2015/0285926 A1 | 10/2015 | Oettinger |
| 2016/0241086 A1 | 8/2016 | Jung |
| 2016/0349782 A1 | 12/2016 | Tsai |

FOREIGN PATENT DOCUMENTS

| | | |
|---|---|---|
| CN | 1930790 A | 3/2007 |
| CN | 101106388 A | 1/2008 |
| CN | 101907730 A | 12/2010 |
| CN | 101978571 A | 2/2011 |
| CN | 102474133 A | 5/2012 |
| CN | 102804619 A | 11/2012 |
| CN | 102904475 A | 1/2013 |
| CN | 103069689 A | 4/2013 |
| CN | 103248130 A | 8/2013 |
| CN | 103425169 A | 12/2013 |
| CN | 103852665 A | 6/2014 |
| CN | 103975497 A | 8/2014 |
| CN | 104521151 A | 4/2015 |
| CN | 104685760 A | 6/2015 |
| CN | 104734370 A | 6/2015 |
| CN | 105049008 A | 11/2015 |
| CN | 105449875 A | 3/2016 |
| CN | 205105005 U | 3/2016 |
| EP | 2 793 355 A1 | 10/2014 |
| JP | 2008206305 A | 9/2008 |
| JP | 2010213414 A | 9/2010 |
| JP | 2013135518 A | 7/2013 |
| JP | 2014171371 A | 9/2014 |
| JP | 2017511117 A | 4/2017 |
| KR | 100650628 B1 | 11/2006 |
| TW | 201034334 A1 | 9/2010 |
| TW | I389416 B1 | 3/2013 |
| TW | I408861 B1 | 9/2013 |
| TW | 201415752 A | 4/2014 |
| TW | 201440368 A | 10/2014 |
| TW | I459676 B | 11/2014 |
| TW | I472897 B | 2/2015 |
| TW | I483509 B | 5/2015 |
| WO | 2013043974 A2 | 3/2013 |
| WO | 2015154086 A1 | 10/2015 |

* cited by examiner

SUPPLYING-END MODULE OF INDUCTION TYPE POWER SUPPLY SYSTEM AND VOLTAGE MEASUREMENT METHOD THEREOF

BACKGROUND OF THE INVENTION

1. Field of the Invention

The present invention relates to a supplying-end module of an induction type power supply system and a voltage measuring method thereof, and more particularly, to a supplying-end module of an induction type power supply system and a voltage measuring method for measuring a coil voltage of a supplying-end coil of the supplying-end module.

2. Description of the Prior Art

In an induction type power supply system, a method of supplying power from a power supply device includes driving a resonant circuit composed of a resonant capacitor and a supplying-end coil having induction characteristics by a driving circuit, so as to generate sine waves by oscillating on the resonant circuit and transmit power to the power receiving device with the sine waves via the coil. The aforementioned sine waves are AC signals. The magnitude of the amplitude of the sine waves determines the magnitude of the output power, and the output power becomes greater as the amplitude becomes greater.

In general, the power of the power supply device of the induction type power supply system is controlled and adjusted by a processor. The processor is required to obtain the magnitude of the amplitude of the sine waves on the supplying-end coil, and converts the magnitude into digital data. The software inside the processor then calculates the digital data for adjusting the power. The above procedures may be performed repeatedly for feeding the adjusted output power back to the processor to be adjusted again. As a result, the optimum efficiency of the output power can be maintained according to load requirements.

Since the sine waves oscillating on the supplying-end coil are the AC signals, the oscillation range of the AC signals is large and crosses the positive voltage region and the negative voltage region, and therefore the AC signals cannot be interpreted and converted by the general analog to digital converter (ADC). The above AC signals can be converted by a high-performance instrumental ADC. However, the instrumental ADC is very expensive which is hardly utilized in the low-price induction type power supply system products. Therefore, U.S. Pat. No. 8,772,979 B2 discloses a method of power self-regulation in an induction type power supply system, wherein the AC signals on the coil are converted into the DC signals via the coil voltage detection circuit, and the DC signal is then inputted to the ADC for further conversion.

However, the aforementioned method has at least two drawbacks. First, the waveform of the signal on the coil is not an ideal sine wave. The waveform of the signals on the coil may be irregular due to the load effect or other factors. In addition, the conversion from the AC signal into the DC voltage signal via a simple rectifier filter circuit is related to the effective value (root mean square value) of the AC signal. Different waveforms correspond to different effective values, which result in different voltage levels of the DC voltage signals. That is, the voltage inputted to the ADC after being rectified or filtered usually cannot reflect the magnitude of the AC signal on the coil accurately. Another drawback is that the AC signal on the coil being rectified and filtered via the coil voltage detection circuit is transmitted to the ADC for further conversion, wherein the filtering process slows the sampling speed down; that is, the variation of the AC signal will be reflected on the output terminal of the coil voltage detection circuit after several cycles pass by. When an amplitude variation suddenly happens on the AC signal, the variation will be completely reflected on the output terminal of the coil voltage detection circuit after several cycles pass by. In such circumstances, the processor cannot immediately detect the amplitude variation of the coil signal and adjust the output power in time, such that the performance of the system is lowered.

Thus, there is a need to provide a voltage measuring method for a coil signal, in order to solve the aforementioned problems.

SUMMARY OF THE INVENTION

It is therefore an objective of the present invention to provide a voltage measuring method for a supplying-end module of an induction type power supply system, in order to obtain a peak voltage of a coil signal on the supplying-end coil accurately, and further adjust the output power fast and accurately in the supplying-end module.

The present invention discloses a voltage measuring method for a supplying-end module of an induction type power supply system. The voltage measuring method includes generating a coil signal on a supplying-end coil of the supplying-end module; clamping the coil signal to generate a clamp coil signal; performing a signal processing on the clamp coil signal to respectively generate a first signal and a second signal; generating a cyclic signal, wherein a frequency of the cyclic signal is equal to a frequency of the coil signal; comparing the first signal with the second signal via a comparator to obtain a first time and a second time when a voltage level of the first signal is equal to a voltage level of the second signal during a cycle of the cyclic signal; calculating a middle time between the first time and the second time; and sampling the clamp coil signal or the coil signal to obtain a peak voltage of the coil signal according to the middle time.

The present invention further discloses a supplying-end module for an induction type power supply system. The supplying-end module includes a supplying-end coil for generating a coil signal; a clamp circuit coupled to the supplying-end coil, for clamping the coil signal to generate a clamp coil signal; a signal processing module coupled to the clamp circuit, for performing a signal processing on the clamp coil signal to respectively generate a first signal and a second signal; a cyclic signal generator for generating a cyclic signal, wherein a frequency of the cyclic signal is equal to a frequency of the coil signal; a comparator coupled to the signal processing module, for comparing the first signal with the second signal to generate a comparison result; a timer coupled to the cyclic signal generator and the comparator, for obtaining a first time and a second time when a voltage level of the first signal is equal to a voltage level of the second signal according to the comparison result during a cycle of the cyclic signal; a processor coupled to the timer, for calculating a middle time between the first time and the second time; and a sampling module coupled to the processor, for sampling the clamp coil signal or the coil signal to obtain a peak voltage of the coil signal according to the middle time.

These and other objectives of the present invention will no doubt become obvious to those of ordinary skill in the art

DETAILED DESCRIPTION

Figure 1:
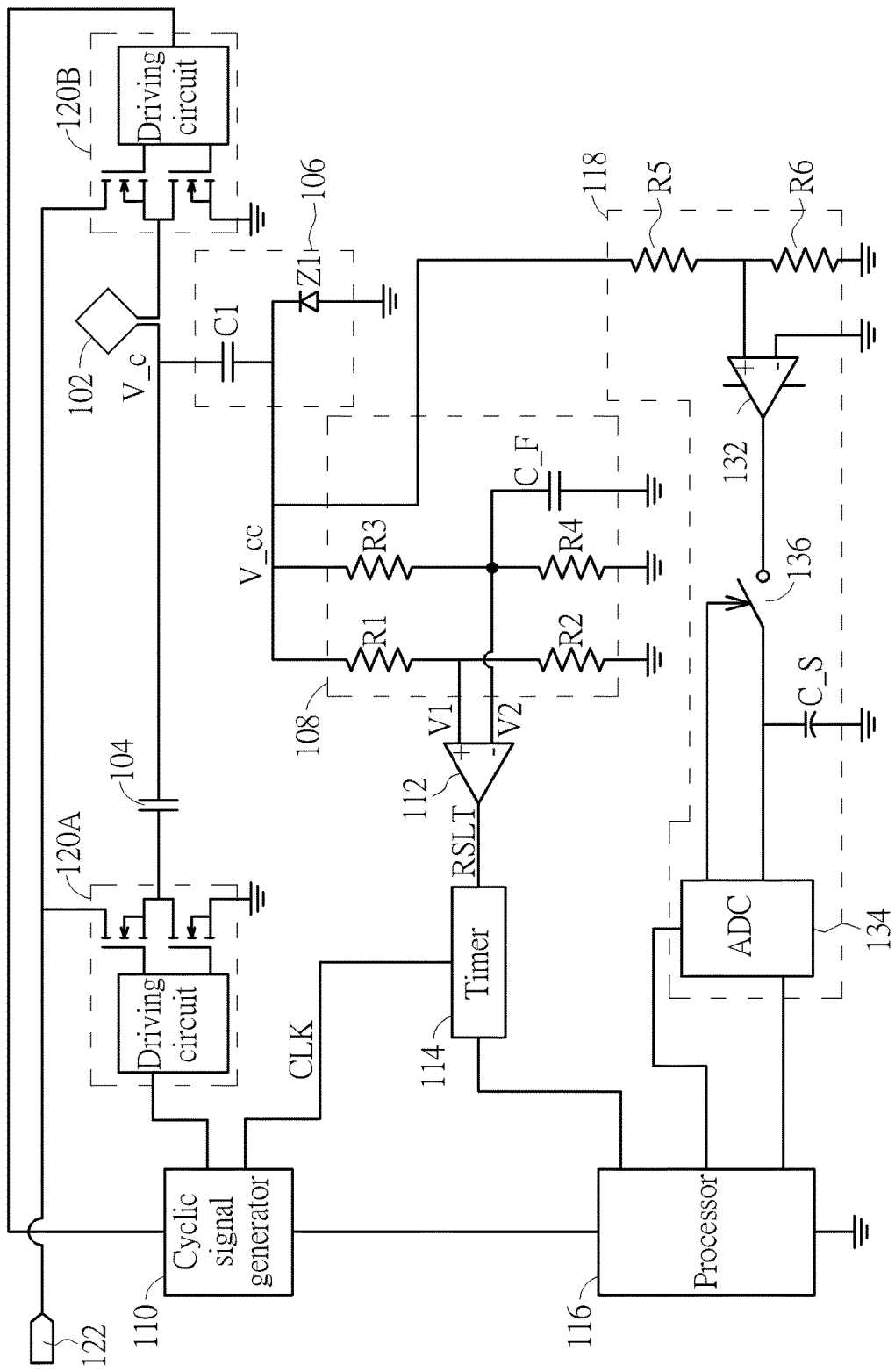
FIG. 1 is a schematic diagram of a supplying-end module of an induction type power supply system according to an embodiment of the present invention.

Please refer to FIG. 1, which is a schematic diagram of a supplying-end module 10 of an induction type power supply system according to an embodiment of the present invention. As shown in FIG. 1, the supplying-end module 10 includes a supplying-end coil 102, a resonant capacitor 104, a clamp circuit 106, a signal processing module 108, a cyclic signal generator 110, a comparator 112, a timer 114, a processor 116, a sampling module 118, driving circuits 120A, 120B and a power supplying unit 122. The supplying-end coil 102 can generate a coil signal V_c and supply power to a power receiving device, and the coil signal V_c is an AC signal. The resonant capacitor 104 is incorporated with the supplying-end coil 102 to generate resonance, in order to generate the AC electromagnetic power and send the AC electromagnetic power to the power receiving device. The clamp circuit 106 is coupled to the supplying-end coil 102, for clamping the coil signal V_c to generate a clamp coil signal V_cc. The signal processing module 108 is coupled to the clamp circuit 106, for performing a signal processing on the clamp coil signal V_cc to respectively generate a first signal V1 and a second signal V2. The cyclic signal generator 110 is utilized for generating a cyclic signal CLK, wherein a frequency of the cyclic signal CLK is equal to a frequency of the coil signal V_c, and the cyclic signal CLK may be a clock signal. The comparator 112 is coupled to the signal processing module 108, for comparing the first signal V1 with the second signal V2 to generate a comparison result RSLT. The timer 114 is coupled to the cyclic signal generator 110 and the comparator 112, for obtaining a first time and a second time when a voltage level of the first signal V1 is equal to a voltage level of the second signal V2 according to the comparison result RSLT during a cycle of the cyclic signal CLK. The processor 116 is coupled to the timer 114, for calculating a middle time between the first time and the second time. The sampling module 118 is utilized for sampling the clamp coil signal V_cc or the coil signal V_c to obtain a peak voltage of the coil signal V_c according to the middle time. The driving circuits 120A, 120B are coupled to the cyclic signal generator 110 and the supplying-end coil 102, for performing a full-bridge driving or a half-bridge driving on the supplying-end coil 102 according to a driving signal outputted by the cyclic signal generator 110. When the full-bridge driving is performed, the processor 116 may instruct the cyclic signal generator 110 to simultaneously output the driving signal to the driving circuit 120A and the driving circuit 120B; when the half-bridge driving is performed, the processor 116 may instruct the cyclic signal generator 110 to output the driving signal to the driving circuit 120A, and connect an input terminal of the driving circuit 120B to the ground (i.e., the driving circuit 120B is not utilized). The detailed operations of the full-bridge driving, the half-bridge driving and the driving circuits 120A, 120B are disclosed in documents related to the induction type power supply system, and will not be narrated herein.

Figure 2:
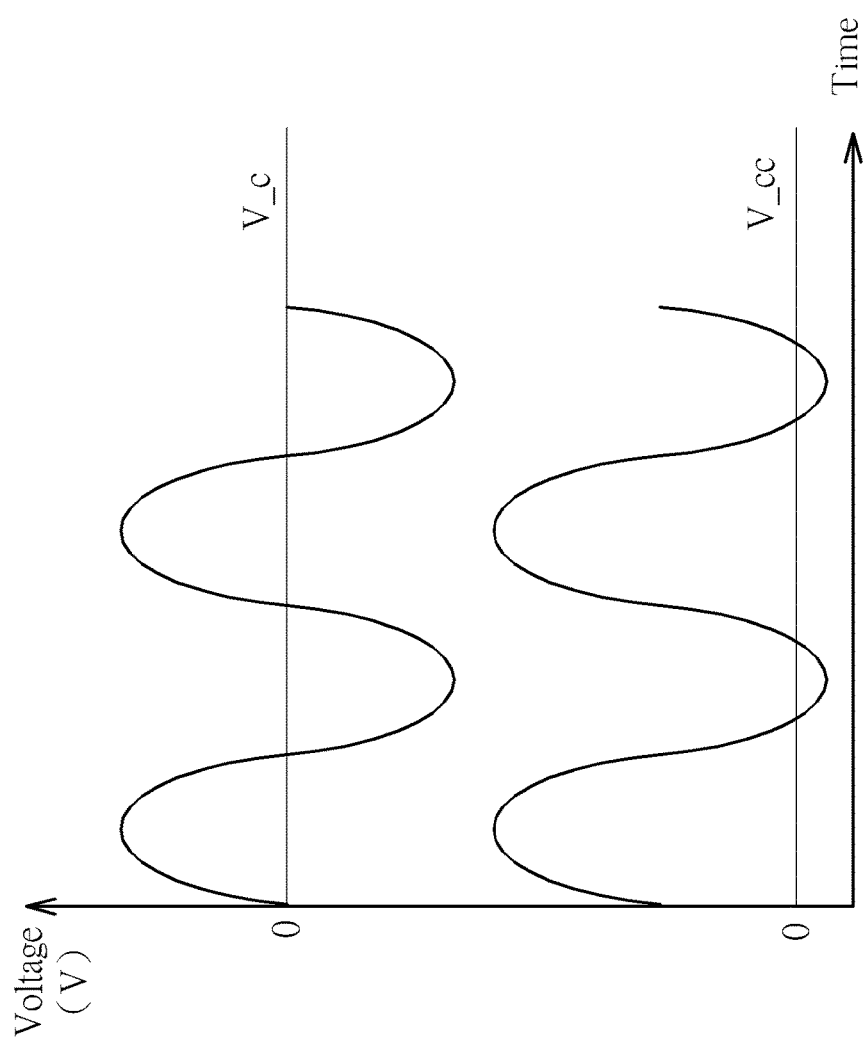
FIG. 2 is a waveform diagram of a coil signal and a clamp coil signal according to the embodiment of the present invention.

In detail, the coil signal V_c is clamped by the clamp circuit 106 first to generate the clamp coil signal V_cc after the coil signal V_c is generated by the supplying-end coil 102. The clamp circuit 106 includes a capacitor C1 and a diode Z1, wherein the capacitor C1 is utilized for coupling the coil signal V_c to the clamp coil signal V_cc, and the diode Z1 is utilized for clamping the coil signal V_c upward. Detailed waveforms of the coil signal V_c and the clamp coil signal V_cc are shown in FIG. 2. Since the coil signal V_c crosses the positive voltage region and the negative voltage region, the average voltage of the coil signal V_c is located in the vicinity of a zero voltage level. Moreover, a negative voltage portion of the coil signal V_c is difficult to be converted or processed. The clamp circuit 106 is therefore utilized to clamp the coil signal V_c upward, so as to clamp the negative voltage portion of the coil signal V_c to the vicinity of the zero voltage level. As a result, the clamp coil signal V_cc is substantially located in the positive voltage level which is more convenient for the signal processing module 108 to perform the following signal processing.

Subsequently, the clamp coil signal V_cc can be inputted to the signal processing module 108 to be processed. The signal processing module 108 includes voltage division resistors R1-R4 and a filter capacitor C_F. The voltage division resistors R1, R2 can perform a first voltage division processing on the clamp coil signal V_cc to generate the first signal V1. The voltage division resistors R3, R4 can perform a second voltage division processing on the clamp coil signal V_cc. The filter capacitor C_F, coupled to the voltage division resistors R3, R4, may perform a low-pass filtering on a signal generated by the second voltage division processing, so as to generate the second signal V2. In general, the amplitude of the coil signal V_c generated on the supplying-end coil 102 of the induction type power supply system is about 100 volts (V), while the operating voltage of the comparator 112 is usually less than 5 V. Therefore, the clamp coil signal V_cc is required to be reduced to a lower voltage level through the voltage division resistors (i.e., the voltage division resistors R1, R2) before entering the comparator 112. It is noteworthy that the magnitudes of the voltage division resistors may be adjusted according to the operating voltage of the comparator or the requirements of the system while different types of comparators are applied. Alternatively, the clamp coil signal V_cc may also be compared directly without the voltage division resistors when the voltage of the clamp coil signal V_cc does not exceed the operating voltage of the comparator. Therefore, the implementation of the voltage division resistors is not a limitation of the present invention. In another aspect, the second signal V2 aims at providing a determination voltage; hence, the second signal V2 is only utilized for being compared with the first signal V1, and the second signal V2 is not required to completely reflect the effective value of the clamp coil signal V_cc or the coil signal V_c. In such circumstances, the filter capacitor C_F may be designed to have a large capacitance for keeping the voltage of the second signal V2 in stable. Thus, the problem where the reflecting speed of the second signal V2 cannot keep up with the amplitude varying speed when the amplitude of the coil signal severely varies can be avoided.

Figure 3:
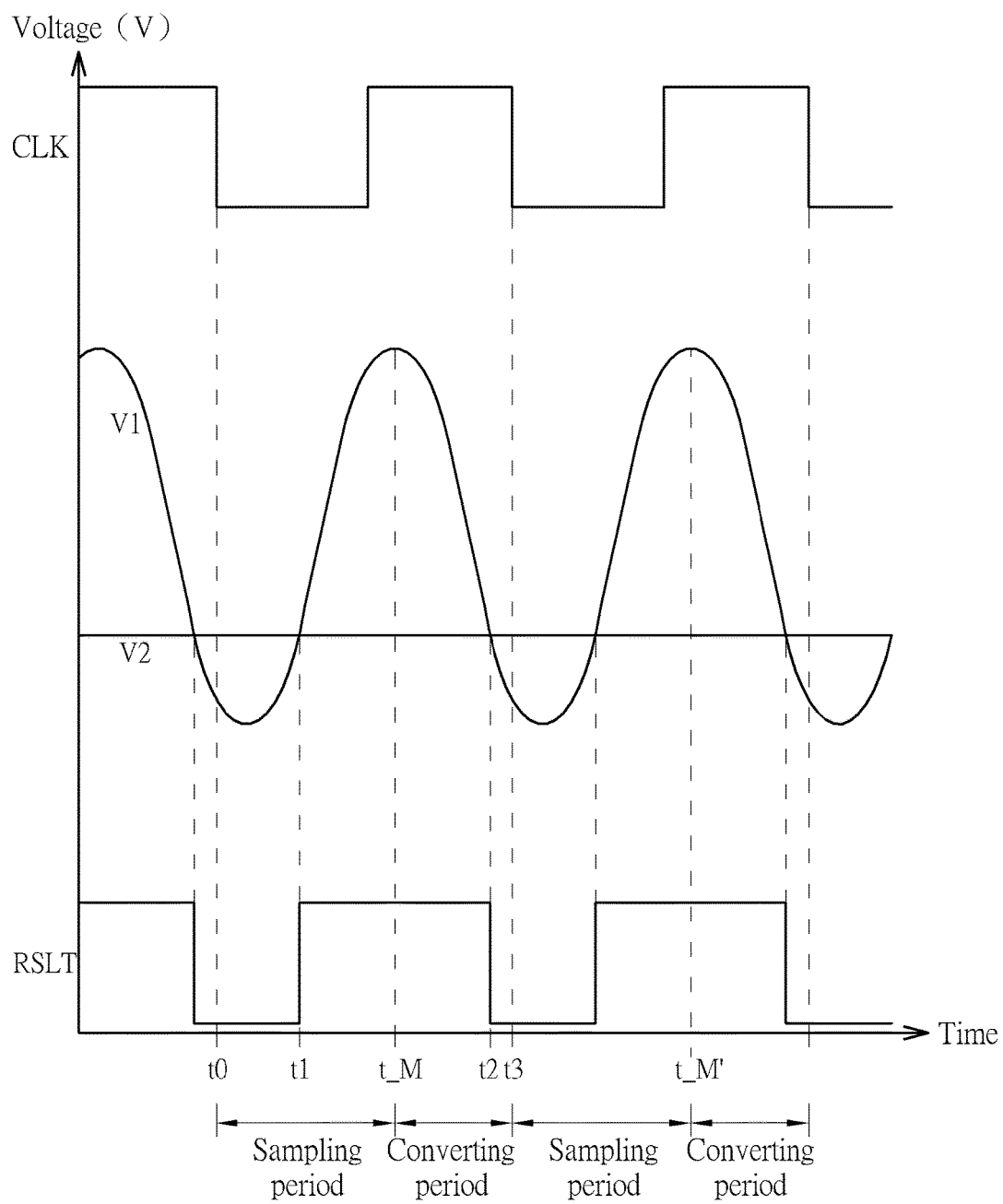
FIG. 3 is a waveform diagram of a first signal, a second signal, a comparison result and a cyclic signal in FIG. 1.

FIG. 3 illustrates waveforms of the first signal V1 and the second signal V2. Preferably, the voltage level of the second signal V2 may be substantially on a quarter of the peak to peak amplitude higher than the minimum value of the first signal V1 (as the voltage level shown in FIG. 3), in order to allow the comparison result RSLT of the comparator 112 to have an easily interpreted waveform. In such a situation, a ratio of an attenuation factor of the first voltage division processing performed by the voltage division resistors R1, R2 to an attenuation factor of the second voltage division processing performed by the voltage division resistor R3, R4 may be 1:4. For example, the peak to peak amplitude of the clamp coil signal V_cc is assumed to be 100 V, the attenuation factor of the first voltage division processing may be set to be 50, and the attenuation factor of the second voltage division processing may be set to be 200; hence, the peak to peak amplitude of the first signal V1 is equal to 2 V, and the second signal V2 has a voltage level generated from a signal with a peak to peak amplitude of 0.5 V after being low-pass filtered. It is noteworthy that the aforementioned method of setting the ratio of the attenuation factor of the first voltage division processing to the attenuation factor of the second voltage division processing to be 1:4 is only one of numerous implementing methods. In practice, as long as the attenuation factor of the first voltage division processing is smaller than the attenuation factor of the second voltage division processing, the voltage level of the second signal V2 may be controlled to fall within a range between the maximum value and the minimum value of the first signal V1, so that the effective comparison result RSLT may be generated by the comparator 112 for the following processing. In another embodiment, the second signal V2 may not be generated from the clamp coil signal V_cc after being divided and filtered, but may be a constant voltage signal directly outputted according to the magnitude of the amplitude of the first signal V1, where the voltage level of the above constant voltage signal falls within the range between the maximum value and the minimum value of the first signal V1.

Subsequently, the signal processing module 108 can output the first signal V1 to a positive input terminal of the comparator 112, and output the second signal V2 to a negative input terminal of the comparator 112. As shown in FIG. 3, when the first signal V1 is greater than the second signal V2, a high voltage level is outputted by the comparator 112; when the first signal V1 is less than the second signal V2, a low voltage level is outputted by the comparator 112. The aforementioned comparison result RSLT is then outputted to the timer 114 by the comparator 112 to perform the following processing. In another embodiment, the signal processing module 108 may output the first signal V1 to the negative input terminal of the comparator 112, and output the second signal V2 to the positive input terminal of the comparator 112. In this case, the comparison result RSLT is inverted comparing to FIG. 3, but the voltage level still switches at the same time and therefore the comparison result RSLT may also be outputted to the timer 114 to perform the following processing.

The timer 114 receives not only the comparison result RSLT from the comparator 112 but also the cyclic signal CLK from the cyclic signal generator 110 simultaneously. The cyclic signal generator 110 may be a pulse width modulation generator (PWM generator) or a clock generator. Alternatively, the cyclic signal generator 110 may include any circuit structure which can generate clock signals or periodically signals. Since the cyclic signal generator 110 may also output the driving signal which is required to operate the driving circuits 120A, 120B, the cyclic signal generator 110 may set the frequency of the cyclic signal CLK to be the same as a frequency of the aforementioned driving signal, so that the frequency of the cyclic signal CLK may also be the same as the frequency of the coil signal V_c. In such circumstances, a specific relation exists between the frequency of the cyclic signal CLK and the switching frequency of the comparison result RSLT. In detail, the voltage level of the comparison result RSLT switches (i.e., the situation where the voltage levels of the first signal V1 and the second signal V2 are the same) twice during each cycle of the cyclic signal CLK as shown in FIG. 3. The timer 114 records these two time points of the voltage level switching. In an embodiment, each cycle may start at a negative edge of the cyclic signal CLK. For example, the timer 114 may start to count time at an initial point (such as a time t0) of a cycle and detect the switching of the voltage level of the comparison result RSLT. A first time t1 can be recorded by the timer 114 when the voltage level of the comparison result RSLT switches first during the cycle, and a second time t2 can be recorded by the timer 114 when the voltage level of the comparison result RSLT switches again during the cycle. Then, the processor 116 can calculate a middle time t_M according to the first time t1 and the second time t2 by the following method:

$$t\_M = \frac{t1 + t2}{2}$$

The processor 116 can control the sampling module 118 to sample the clamp coil signal V_cc based on the middle time t_M after the processor 116 has calculated the middle time t_M. The sampling module 118 includes a buffer amplifier 132, a storage capacitor CS, an analog to digital converter (ADC) 134, a converting switch 136 and voltage division resistors R5, R6. The operation of the sampling module 118 can be divided into two stages: a sampling period and a converting period. The sampling period and the converting period are divided base on the middle time t_M. Specifically, the sampling period terminates at the middle time t_M and the converting period starts at the middle time t_M during a cycle of the cyclic signal CLK, as shown in FIG. 3.

The voltage level of the clamp coil signal V_cc can first be lowered by the voltage division resistors R5, R6 when the clamp coil signal V_cc is inputted to the sampling module 118. As mentioned above, the magnitudes of the voltage division resistors R5, R6 may be adjusted according to the operating voltage of each element inside the sampling module 118 (such as the buffer amplifier 132, the ADC 134 and the converting switch 136). Alternatively, the clamp coil signal V_cc may be sampled directly without being divided by the voltage division resistors when the voltage of the clamp coil signal V_cc does not exceed the operating voltage of each element inside the sampling module 118. Therefore, the implementation of the voltage division resistors is not a limitation of the present invention. In another aspect, the clamp coil signal V_cc is sampled by the sampling module 118 in the embodiment shown in FIG. 1, while in another embodiment, the coil signal V_c may be sampled by the sampling module 118 directly to obtain the peak voltage of the coil signal V_c, but not limited thereto.

Specifically, the converting switch 136 is turned on in the sampling period, where the clamp coil signal V_cc or the coil signal V_c can be sampled by the buffer amplifier 132 and the voltage sampled by the buffer amplifier 132 can then be stored in the storage capacitor C_S. The converting switch 136 is turned off in the converting period, where the ADC 134 can convert the voltage stored in the storage capacitor C_S into a digital data and the digital data is then outputted to the processor 116. The digital data is corresponding to the peak voltage of the supplying-end coil 102. In other words, as long as the sampling can terminate at the middle time t_M and the conversion can start at the middle time t_M accurately, the voltage of the coil signal V_c at the middle time t_M, i.e., the peak voltage, can be obtained, as shown in FIG. 3. It is noteworthy that in the aforementioned embodiment, the voltage inputted to the ADC 134 is the peak voltage. This is different from the prior art where the DC signal inputted to the ADC is generated from the rectified and filtered AC signal and the voltage of the DC signal is the effective value of the AC signal.

Preferably, the sampling period may start at the time when the clamp coil signal V_cc or the coil signal V_c begins to rise. That is, the converting switch 136 may be turned on at the time when the clamp coil signal V_cc or the coil signal V_c (hereinafter called the input signal, which stands for the input signal of the sampling module 118) begins to rise, so that the storage capacitor C_S may be charged by the buffer amplifier 132. Since the charging process requires time, the sampling step may start at the time when the input signal begins to rise and terminate at the time when the input signal reaches the peak of the waveform, i.e., the middle time t_M. At this moment, the voltage of the storage capacitor CS is equal to the peak voltage of the input signal. Subsequently, the converting switch 136 is turned off, and the ADC 134 is activated to convert the voltage stored in the storage capacitor C_S into the digital data, so that the digital data can correspond to the peak voltage of the input signal. In order to carry out the above operations, the processor 116 used for controlling the sampling module 118 is required to obtain the cycle time of the voltage variation of the sine wave on the coil.

In the supplying-end module 10 of the induction type power supply system, the cyclic signal generator 110 can output a cyclic signal to control the driving circuits 120A, 120B, and the driving circuits 120A, 120B can accordingly drive the supplying-end coil 102 and the resonant capacitor 104 to resonate to generate the sine wave. However, the frequency of the sine wave signal on the coil may be varied due to the influence from the frequency of the control signal, and the load effect in the power receiving device may shift the phase of the sine wave signal. Therefore, the cycle time of the voltage variation of the sine wave can be obtained by calculating the middle time t_M according to the first time t1 and the second time t2, so that the middle time t_M is corresponding to the peak of the waveform of the coil signal V_c via the operations of the timer 114 and the comparator 112. In another aspect, the sampling period may start at the time when a cycle of the cyclic signal CLK begins. The sampling period may also start at the time previous to the middle time t_M by a half of a cycle length (i.e., at the wave trough of the coil signal V_c) according to the middle time t_M and the cycle length of the cyclic signal CLK. For example, as shown in FIG. 3, the processor 116 obtains the first time t1 and the second time t2 before calculating the middle time. Therefore, the sampling module 118 may start sampling at the time when the next cycle of the cyclic signal CLK begins (i.e., time t3), and stop sampling and start converting the voltage stored in the capacitor CS into the digital data at the middle time t_M' of the next cycle of the cyclic signal CLK according to the first time t1 and the second time t2.

It is noteworthy that one of the objectives of the present invention is obtaining the magnitude of the peak voltage of the coil, where the magnitude of the peak voltage can be used for determining the output power of the induction type power supply system for power adjustment. Those skilled in the art can make modifications and alternations accordingly. For example, the coil signal V_c may be inputted to the sampling module 118 in any form. Since a specific clamping relation exists between the clamp coil signal V_cc and the coil signal V_c and the coil signal after being divided undergoes a fixed attenuation from the original coil signal V_c, the digital data outputted by the sampling module 118 is corresponding to the magnitude of the peak voltage of the original coil signal V_c no matter whether the sampling module 118 samples the clamp coil signal V_cc, the coil signal V_c, the clamp coil signal V_cc after being divided or the coil signal V_c after being divided. That is, the digital data outputted by the sampling module 118 increases in accordance with an increasing of the peak voltage of the coil signal V_c; and the digital data outputted by the sampling module 118 decreases in accordance with a decreasing of the peak voltage of the coil signal V_c. As a result, the processor 116 can adjust the power according to the magnitude of the peak voltage no matter whether the signal sampled by the sampling module 118 is the clamp coil signal V_cc or the coil signal V_c, or whether the signal sampled by the sampling module 118 is divided or not.

Figure 4:
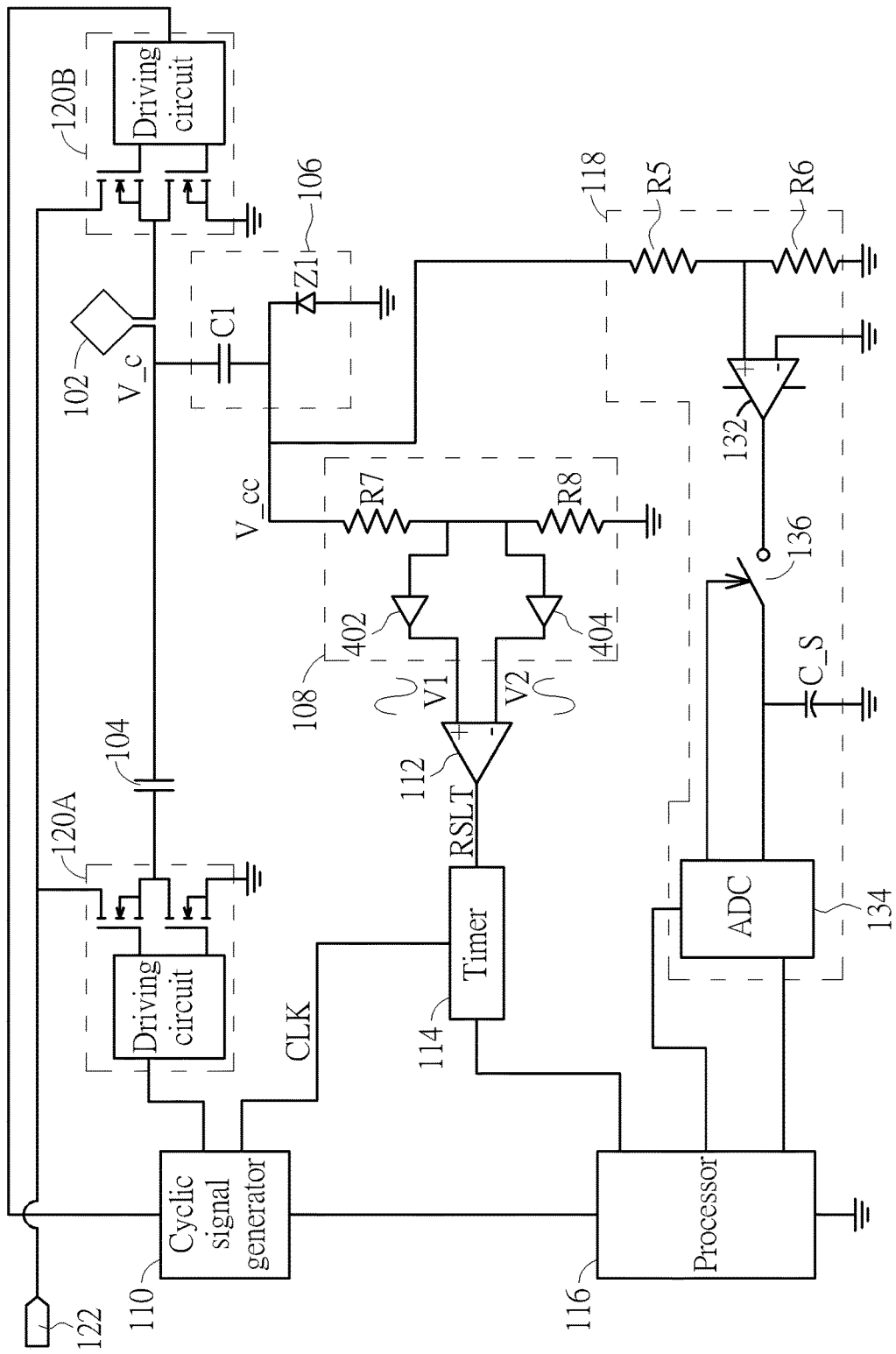
FIG. 4 is a schematic diagram of another supplying-end module of an induction type power supply system according to the embodiment of the present invention.

In another embodiment, the middle time may be obtained by other methods. Please refer to FIG. 4, which is a schematic diagram of another supplying-end module 40 of an induction type power supply system according to the embodiment of the present invention. For example, the structure of the supplying-end module 40 is similar to that of the supplying-end module 10, and hence the elements and signals with the same functions are denoted by the same symbols. The difference between the supplying-end module 40 and the supplying-end module 10 is the structure of the signal processing module 108. In the supplying-end module 40, the signal processing module 108 includes a non-inverting amplifier 402, an inverting amplifier 404 and resistors R7, R8. The clamp coil signal V_cc can be divided by the resistors R7, R8. The non-inverting amplifier 402 directly outputs the clamp coil signal V_cc after being divided to generate the first signal V1. The inverting amplifier 404 inverts the clamp coil signal V_cc after being divided to generate the second signal V2. In such a situation, the first signal V1 is inverted to the second signal V2. Subsequently, the comparator 112 can compare the first signal V1 with the second signal V2 to generate the comparison result RSLT. The timer 114 can output the first time t1 and the second time t2 according to the comparison result RSLT, in order to calculate the middle time t_M which is corresponding to the peak of the waveform of the coil signal V_c. It is noteworthy that in this example, the magnitudes of the resistors R7, R8 may be adjusted according to the operating voltages of the non-inverting amplifier 402 and the inverting amplifier 404. Alternatively, the clamp coil signal V_cc may be directly inputted to the non-inverting amplifier 402 and the inverting amplifier 404 without being divided by any resistor, but not limited thereto.

Figure 5:
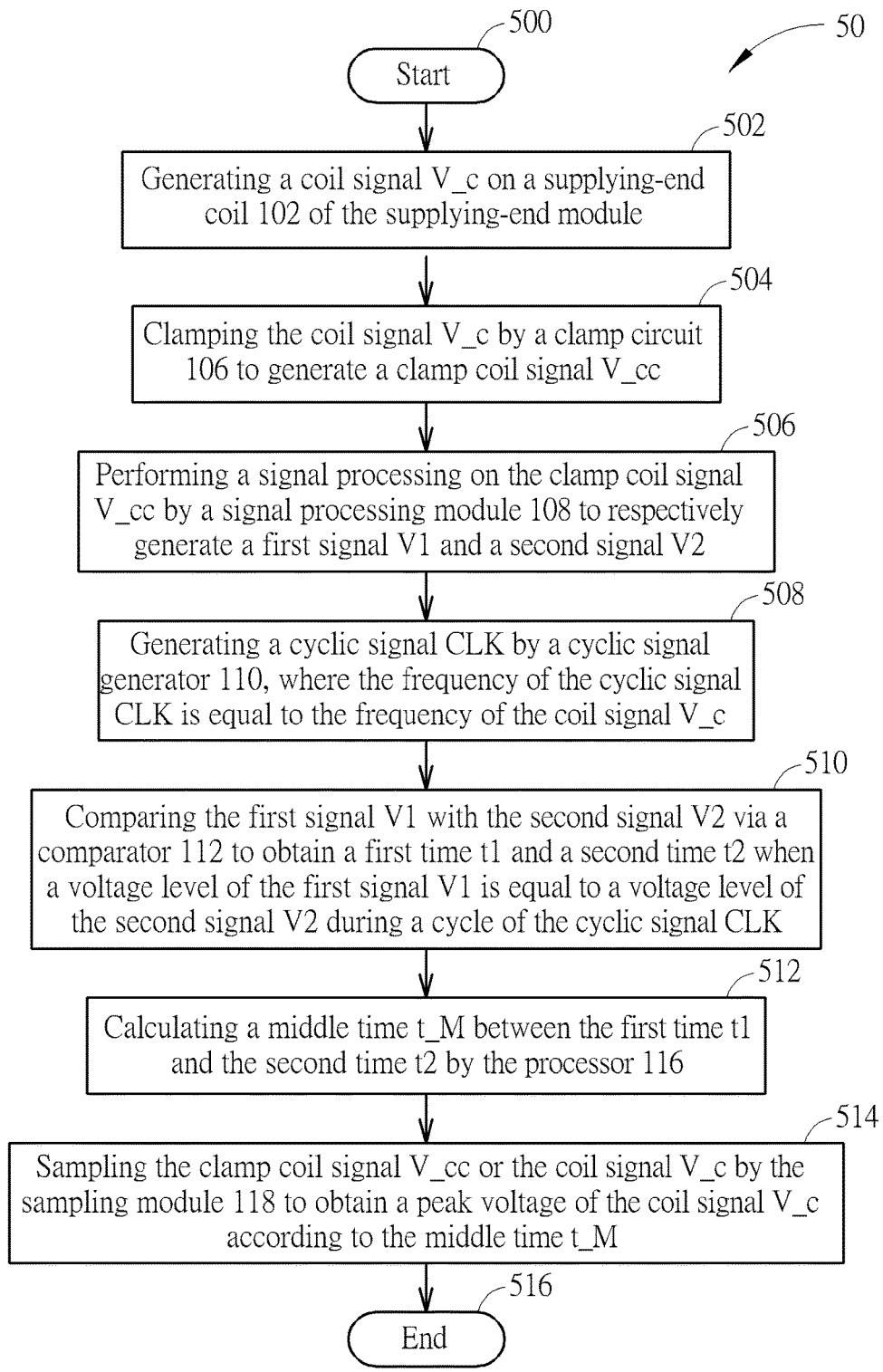
FIG. 5 is a schematic diagram of a voltage measuring process according to an embodiment of the present invention.

The aforementioned operations of the supplying-end module 10 and the supplying-end module 40 can be summarized into a voltage measuring process 50, as shown in FIG. 5. The voltage measuring process 50 includes the following steps:

Step 500: Start.

Step 502: Generating a coil signal V_c on a supplying-end coil 102 of the supplying-end module.

Step 504: Clamping the coil signal V_c by a clamp circuit 106 to generate a clamp coil signal V_cc.

Step 506: Performing a signal processing on the clamp coil signal V_cc by a signal processing module 108 to respectively generate a first signal V1 and a second signal V2.

Step 508: Generating a cyclic signal CLK by a cyclic signal generator 110, where the frequency of the cyclic signal CLK is equal to the frequency of the coil signal V_c.

Step 510: Comparing the first signal V1 with the second signal V2 via a comparator 112 to obtain a first time t1 and a second time t2 when a voltage level of the first signal V1 is equal to a voltage level of the second signal V2 during a cycle of the cyclic signal CLK.

Step 512: Calculating a middle time t_M between the first time t1 and the second time t2 by the processor 116.

Step 514: Sampling the clamp coil signal V_cc or the coil signal V_c by the sampling module 118 to obtain a peak voltage of the coil signal V_c according to the middle time t_M.

Step 516: End.

The detailed operations and variations of the voltage measuring process 50 are illustrated in the aforementioned descriptions, and will not be narrated herein.

In the prior art, the method of determining the magnitude of the power is obtaining the effective value or the average voltage of the AC signal after the AC signal on the coil is converted into the DC signal. However, in the induction type power supply system, the waveform of the coil signal is easily varied due to the load effect, such that the aforementioned effective value or average voltage cannot reflect the power of the AC signal on the coil accurately. In contrast, the present invention measures the peak voltage as a basis for adjusting the power. In the embodiments of the present invention, the signal processing module, the modules such as the cyclic signal generator, the comparator, the timer, and the processor can cooperate to obtain the middle time corresponding to the peak voltage of the coil signal. The sampling module then samples the clamp coil signal or the coil signal according to the middle time to obtain the voltage of the coil signal at the middle time (i.e., the peak voltage). In such a situation, the peak voltage of the coil signal can be obtained accurately in the present invention, for enhancing the accuracy of the power adjustment. In addition, the middle time obtained in each cycle can be the time point to terminate sampling and the time point to start converting in the next cycle. In contrast to the prior art where the sudden amplitude variations are reflected on the output terminal of the coil voltage detection circuit after several cycles pass by, in the embodiments of the present invention, when the phase or the amplitude of the coil signal varies, the accurate middle time can be obtained in the next cycle for obtaining the accurate peak voltage. As a result, the processor can detect the variation of the coil signal quickly and thereby adjust the output power in time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage measuring method for a supplying-end module of an induction type power supply system, the voltage measuring method comprising:
   generating a coil signal on a supplying-end coil of the supplying-end module;
   clamping the coil signal to generate a clamp coil signal;
   performing a signal processing on the clamp coil signal to respectively generate a first signal and a second signal;
   generating a cyclic signal, wherein a frequency of the cyclic signal is equal to a frequency of the coil signal;
   comparing the first signal with the second signal via a comparator to obtain a first time and a second time when a voltage level of the first signal is equal to a voltage level of the second signal during a cycle of the cyclic signal;
   calculating a middle time between the first time and the second time; and
   sampling the clamp coil signal or the coil signal to obtain a peak voltage of the coil signal according to the middle time.

2. The voltage measuring method of claim 1, wherein the step of clamping the coil signal to generate the clamp coil signal comprises:
   clamping the coil signal upward to shift a negative voltage portion of the coil signal to be greater than a zero voltage level.

3. The voltage measuring method of claim 1, wherein the step of performing the signal processing on the clamp coil signal to respectively generate the first signal and the second signal comprises:
   performing a first voltage division processing on the clamp coil signal to generate the first signal; and
   performing a second voltage division processing on the clamp coil signal and generating the second signal through a low-pass filtering.

4. The voltage measuring method of claim 3, wherein an attenuation factor of the first voltage division processing is smaller than an attenuation factor of the second voltage division processing.

5. The voltage measuring method of claim 3, wherein a ratio of the attenuation factor of the first voltage division processing to the attenuation factor of the second voltage division processing is 1:4.

6. The voltage measuring method of claim 1, wherein the step of performing the signal processing on the clamp coil signal to respectively generate the first signal and the second signal comprises:
   outputting the clamp coil signal directly to generate the first signal; and
   inverting the clamp coil signal to generate the second signal.

7. The voltage measuring method of claim 6, wherein the clamp coil signal is outputted directly to generate the first signal or inverted to generate the second signal after the clamp coil signal is divided.

8. The voltage measuring method of claim 1, wherein the frequency of the cyclic signal is the same as a frequency of a driving signal used for driving the supplying-end coil, so that the frequency of the cyclic signal is equal to the frequency of the coil signal.

9. The voltage measuring method of claim 1, wherein the step of sampling the clamp coil signal or the coil signal to obtain the peak voltage of the coil signal according to the middle time comprises:

sampling the clamp coil signal or the coil signal during a sampling period, to charge a storage capacitor by the clamp coil signal or the coil signal, wherein the sampling period terminates at the middle time; and converting a voltage stored in the storage capacitor into a digital data corresponding to the peak voltage during a converting period, wherein the converting period starts at the middle time.

10. A supplying-end module used for an induction type power supply system, the supplying-end module comprising:

a supplying-end coil for generating a coil signal;

a clamp circuit coupled to the supplying-end coil, for clamping the coil signal to generate a clamp coil signal;

a signal processing module coupled to the clamp circuit, for performing a signal processing on the clamp coil signal to respectively generate a first signal and a second signal;

a cyclic signal generator for generating a cyclic signal, wherein a frequency of the cyclic signal is equal to a frequency of the coil signal;

a comparator coupled to the signal processing module, for comparing the first signal with the second signal to generate a comparison result;

a timer coupled to the cyclic signal generator and the comparator, for obtaining a first time and a second time when a voltage level of the first signal is equal to a voltage level of the second signal according to the comparison result during a cycle of the cyclic signal;

a processor coupled to the timer, for calculating a middle time between the first time and the second time; and a sampling module coupled to the processor, for sampling the clamp coil signal or the coil signal to obtain a peak voltage of the coil signal according to the middle time.

11. The supplying-end module of claim 10, wherein the coil signal is clamped upward by the clamp circuit, and a negative voltage portion of the coil signal is shifted to be greater than a zero voltage level to generate the clamp coil signal.

12. The supplying-end module of claim 10, further comprising:

a driving circuit coupled to the cyclic signal generator and the supplying-end coil, for performing a full-bridge driving or a half-bridge driving on the supplying-end coil according to the cyclic signal.

13. The supplying-end module of claim 12, wherein the frequency of the cyclic signal is the same as a frequency of a driving signal outputted by the driving circuit, so that the frequency of the cyclic signal is equal to the frequency of the coil signal.

14. The supplying-end module of claim 10, wherein the signal processing module comprises:

a first resistor and a second resistor for performing a first voltage division processing on the clamp coil signal to generate the first signal;

a third resistor and a fourth resistor, for performing a second voltage division processing on the clamp coil signal; and a filter capacitor coupled to the third resistor and the fourth resistor, for performing a low-pass filtering on a signal generated after the second voltage division processing to generate the second signal.

15. The supplying-end module of claim 14, wherein an attenuation factor of the first voltage division processing is smaller than an attenuation factor of the second voltage division processing.

16. The supplying-end module of claim 14, wherein a ratio of the attenuation factor of the first voltage division processing to the attenuation factor of the second voltage division processing is 1:4.

17. The supplying-end module of claim 10, wherein the signal processing module comprises:

a non-inverting amplifier, for directly outputting the clamp coil signal to generate the first signal; and an inverting amplifier, for inverting the clamp coil signal to generate the second signal.

18. The supplying-end module of claim 17, wherein the signal processing module further comprises:

a first resistor and a second resistor, for dividing the clamp coil signal;

wherein the clamp coil signal is divided by the first resistor and the second resistor, and then directly outputted by the non-inverting amplifier to generate the first signal or inverted by the inverting amplifier to generate the second signal.

19. The supplying-end module of claim 10, wherein the first time is recorded by the timer when a voltage level of the comparison result switches first during the cycle of the cyclic signal, and the second time is recorded by the timer when the voltage level of the comparison result switches again during the cycle.

20. The supplying-end module of claim 10, wherein the sampling module comprises:

a buffer amplifier, for sampling the clamp coil signal or the coil signal during a sampling period, wherein the sampling period terminates at the middle time;

a storage capacitor, for storing a voltage of the clamp coil signal or the coil signal sampled by the buffer amplifier;

an analog to digital converter, for converting the voltage stored in the storage capacitor into a digital data corresponding to the peak voltage during a converting period, wherein the converting period starts at the middle time; and a converting switch coupled to the analog digital converter, the storage capacitor and the buffer amplifier, for being turned on during the sampling period to carry out the sampling step of the buffer amplifier, and turned off during the converting period to carry out the converting step of the analog to digital converter.

* * * * *